(12) United States Patent
Biber et al.

(10) Patent No.: US 8,507,855 B2
(45) Date of Patent: Aug. 13, 2013

(54) INDUCTIVE MODULATION OF FOCUSING VOLTAGE IN CHARGED BEAM SYSTEM

(75) Inventors: Tuvia Biber, Rishon-Lezion (IL); Efim Kerner, Rehovot (IL)

(73) Assignee: Applied Materials Israel, Ltd., Rehovot (IL)

( * ) Notice: Subject to any disclaimer, the term of this patent is extended or adjusted under 35 U.S.C. 154(b) by 69 days.

(21) Appl. No.: 13/192,903

(22) Filed: Jul. 28, 2011

(65) Prior Publication Data

US 2013/0026362 A1  Jan. 31, 2013

(51) Int. Cl.
*H01J 3/14* (2006.01)
*H01J 37/26* (2006.01)

(52) U.S. Cl.
USPC .......................... 250/307; 250/398

(58) Field of Classification Search
USPC ............. 250/396 R, 398, 306, 307; 315/223, 315/283–284
See application file for complete search history.

(56) References Cited

U.S. PATENT DOCUMENTS

| | | | | |
|---|---|---|---|---|
| 4,587,465 | A * | 5/1986 | Truskalo | 315/382 |
| 2005/0017192 | A1* | 1/2005 | Shemesh et al. | 250/396 R |
| 2007/0120054 | A1* | 5/2007 | Yoon et al. | 250/307 |
| 2007/0252658 | A1* | 11/2007 | Bumiller | 333/24 R |
| 2009/0114817 | A1* | 5/2009 | Bullock | 250/307 |
| 2009/0272900 | A1* | 11/2009 | Nir | 250/307 |

* cited by examiner

*Primary Examiner* — Robert Kim
*Assistant Examiner* — David E Smith
(74) *Attorney, Agent, or Firm* — Kilpatrick Townsend & Stockton LLP

(57) ABSTRACT

A modulator of a charged particle beam system is arranged to generate a modulation signal that is provided to an inductor, which receives the modulation signal and modulates, by inductance, a supply voltage signal for the charged particle beam system. Modulation of the supply voltage signal changes a focal length of a charged particle beam produced by the charged particle beam system.

27 Claims, 10 Drawing Sheets

INDUCTIVE MODULATION OF FOCUSING VOLTAGE IN CHARGED BEAM SYSTEM

FIELD OF THE INVENTION

The present invention is related to charged particle beam systems and, in particular, to a modulator for providing a modulated supply voltage signal to change a focal length of a charged particle beam for such systems.

BACKGROUND

Charged particle beam columns are typically employed in scanning electron microscopy (SEM), which is a known technique widely used in the manufacture of semiconductor wafers, being utilized in a CD metrology tool, the so-called CD-SEM (critical dimension scanning electron microscope), and a defect review SEM (DR-SEM).

In SEM, the region of a sample to be examined is two-dimensionally scanned by means of a focused primary beam of electrically charged particles, usually electrons. Irradiation of the sample with the primary electron beam releases secondary (and/or backscattered) electrons. The secondary electrons are released at that side of the sample at which the primary electron beam is incident, and move back to be captured by a detector, which generates an output electric signal proportional to the so-detected electric current. The energy and/or the energy distribution of the secondary electrons is indicative of the nature and composition of the sample.

Various CD-SEMs and method for measuring critical dimensions are illustrated in the following U.S. patent applications which are incorporated herein by reference: U.S. patent application publication number 2003/0015699 of Su, titled "Integrated critical dimension control for semiconductor device manufacturing"; U.S. patent application publication number 2005/0048654 of Wu, titled "Method of evaluating reticle pattern overlay registration"; U.S. patent application publication number 2004/0173746 of Petrov, et al., titled "Method and system for use in the monitoring of samples with a charged particles beam"; U.S. patent application publication number 2004/0056207 of Petrov, et al., titled "Deflection method and system for use in a charged particle beam column"; U.S. patent application publication number 2003/0218133 of Petrov, et al., titled "Charged particle beam column and method for directing a charged particle beam", and U.S. patent application publication number 2003/0209667 of Petrov, et al., titled "Charged particle beam apparatus and method for inspecting samples.

An SEM includes such main constructional parts as an electron beam source (formed with a small tip called an "electron gun"), an electron beam column, and a detector unit. The detector unit may be located outside the propagation path of the primary beam through the column, or may be located in the path of the primary beam (the so-called "in-column" or "in-lens" detector). The electron beam column includes, inter alia, a beam focusing/deflecting arrangement formed by a lens assembly and a deflector assembly. The deflection of the primary beam provides for scanning the beam within a scan area on the sample, and also for adjusting incidence of the primary beam onto the sample (an angle of incidence and/or beam shift), as well as directing the secondary beam to the detector.

In order to obtain high resolution, the SEM scans the sample with a very narrow spot while using very high acceleration voltages. Specifically, the electron optical elements are more effective (i.e., produce smaller aberrations) when the electrons are accelerated to high kinetic energy. Scanning the sample with such a narrow spot causes the sample to be charged along the scan path of the charge particle beam.

Preciseness of measurements, such as CD measurements on semiconductor wafers and especially on lithographic masks (reticles), typically suffers from this negative charging of the sample's surface by the scanning beam of charged particles, which causes an image drift. U.S. Pat. No. 6,555,815, assigned to the assignee of the present application, discloses a charged particle beam column where charging of the specimen is avoided or reduced by injecting inert gas onto the sample's surface.

SUMMARY OF THE INVENTION

In accordance with an embodiment of the invention, a charged particle beam system is provided and may include: a charged particle beam (e.g., an electron beam) source arranged to generate a charged particle beam; a charged particle beam controller arranged to control the charged particle beam source by sending multiple supply voltage signals, via multiple supply lines, to the charged particle beam source; and a modulator that may be arranged to modulate a supply voltage signal of the multiple supply voltage signals, by inductance, to provide a modulated supply voltage signal that changes a focal length of the charged particle beam.

According to a further embodiment of the invention, a modulator is provided and may include a modulation signal generator arranged to generate a modulation signal; and an inductor, arranged to receive the modulation signal and to perform a modulation, by inductance, of a supply voltage signal that passes through a supply line, to provide a modulated supply voltage signal; wherein the modulation of the supply voltage signal changes a focal length of a charged particle beam system (e.g., an electron beam system) which includes the modulator. The modulation of the supply voltage signal may defocus the charged particle beam.

The supply line may include an input that is coupled to a charged particle beam controller and an output that is coupled to a charged particle beam source; wherein the inductor is located in proximity to the output.

The inductor may include a first winding arranged to receive the modulation signal; and a coil, wherein the supply line passes through an aperture defined by the coil.

The modulation signal generator may be arranged to generate the modulation signal, wherein the modulation signal may include multiple repetitions of a cyclic signal. In some instances, the modulation signal may include at least ten repetitions of a cyclic signal that has a frequency of at least ten megahertz. Further, the modulation signal generator may be arranged to generate the modulation signal during a fly-back period of the charged particle beam.

The modulation signal generator may additionally or otherwise be arranged to repetitively generate the modulation signal and the inductor may be arranged to repetitively modulate, by inductance, the supply voltage signal.

In some cases, the inductor may be arranged to modulate, by inductance, multiple supply voltage signals that pass through multiple supply lines to provide multiple modulated supply voltage signals that are provided to a charged particle beam source. The inductor may be arranged to modulate the multiple supply voltage signals without changing relationships between the multiple supply voltage signals. The multiple supply voltage signals may be filament supply voltages, a suppressor voltage and an acceleration voltage.

According to still a further embodiment of the invention a method for modulating a supply voltage of a charged particle beam system is provided and may include: generating, by a modulation signal generator, a modulation signal; and modulating, in response to the modulation signal and by inductance, a supply voltage signal that passes through a supply line, to provide a modulated supply voltage signal; wherein the modulating of the supply voltage signal changes a focal length of a charged particle beam system. In particular, the modulating of the supply voltage signal may cause a defocus of a charged particle beam produced by the charged particle beam system.

The method may include modulating the supply voltage signal by an inductor that is located near an output of the supply line, wherein the output is coupled to a charged particle beam source. In some instances, the method may include modulating by a modulation signal that may include multiple repetitions of a cyclic signal; for example, modulating by a modulation signal that includes at least ten repetitions of a cyclic signal that has a frequency of at least ten megahertz.

In some embodiments of the invention, the modulation signal may be generated during a fly-back period of the charged particle beam. Further, the method may include repeated generation of the modulation signal and the modulating of the supply voltage signal.

The method may include modulating, by inductance, multiple supply voltage signals that pass through multiple supply lines to provide multiple modulated supply voltage signals that are provided to a charged particle beam source. The multiple supply voltage signals may be modulated without changing relationships between the multiple supply voltage signals. The multiple supply voltage signals may be filament supply voltages, a suppressor voltage and an acceleration voltage.

According to yet a further embodiment of the invention a method for controlling a charged particle beam is provided, the method may include: generating, by a charged particle beam source, a charged particle beam; controlling the charged particle beam source by sending multiple supply voltage signals, via multiple supply lines; and modulating a supply voltage signal of the multiple supply voltage signals, by inductance, to provide a modulated supply voltage signal that changes a focal length of the charged particle beam.

The method may include obtaining images of areas of a sample during image grab periods; and modulating the supply voltage signal and allowing the supply voltage signal to stabilize after being modulated during idle periods; wherein an idle period is followed by an image grab period.

BRIEF DESCRIPTION OF THE DRAWINGS

The present invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
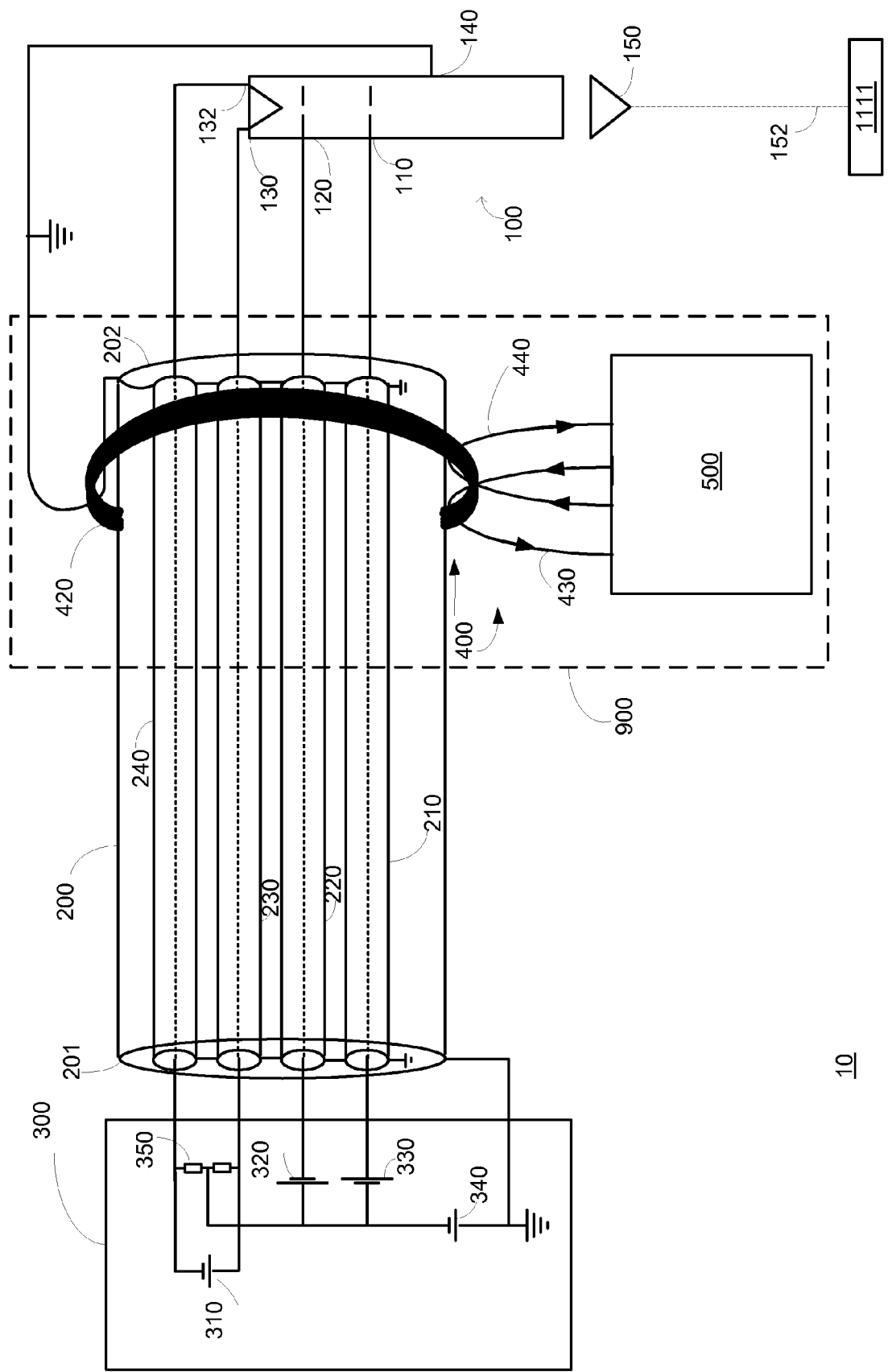
FIG. 1 illustrates a sample and a system that includes a modulator configured according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

According to a various embodiments of the invention, a modulator and a system that includes a modulator are provided. One or more supply voltage signals that affect the focal length of a charged particle beam is/are modulated by inductance. This modulation, especially when applied proximate to the output of the supply voltage signals, can be include very fast modulations. The change rate of a modulation signal can be much faster than the response rate of a supply voltage signal generator and supply lines.

Modulating the supply voltage signal by a modulation signal that includes cyclic signals that have a very high frequency allows the modulation signal to stabilize very quickly. The modulation of the supply voltage signal may cause the charged particle beam to defocus and thus discharge an area of the sample that is charged while being imaged by the focused changed particle beam.

According to various embodiments of the invention, a modulator is provided. Non-limiting examples of such a modulator are illustrated in FIGS. 1-4.

Figure 5:
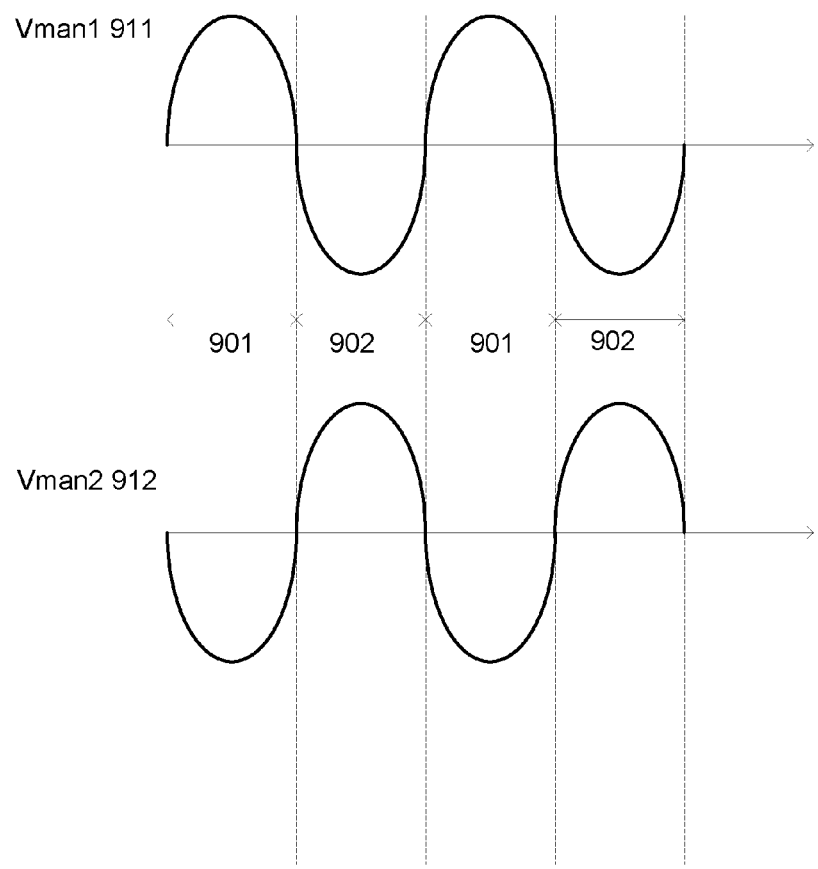
FIG. 5 illustrates control and modulation signals for a charged particule beam system according to an embodiment of the invention.
Figure 5:
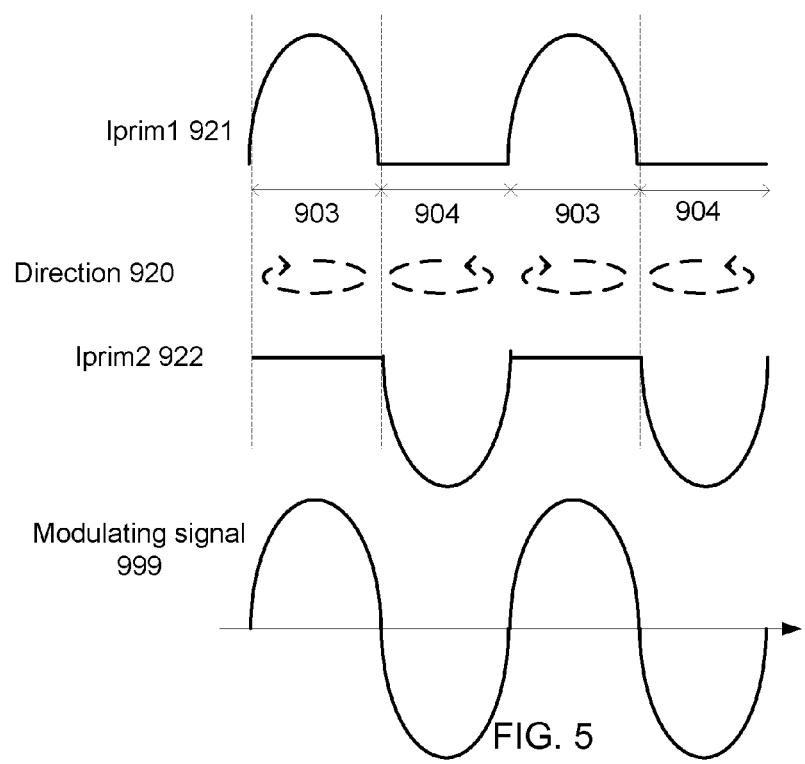

Referring to the example set forth in FIG. 1, the modulator 900 may include a modulation signal generator 500 that is arranged to generate a modulation signal and an inductor 400. The inductor may include coils 420 and two primary windings 430 and 440 or may include any other inductors known in the art. It can, for example, have one coil or more. The modulation signal 999 can be a superposition of multiple modulations signals, as illustrated in FIG. 5.

Figure 6:
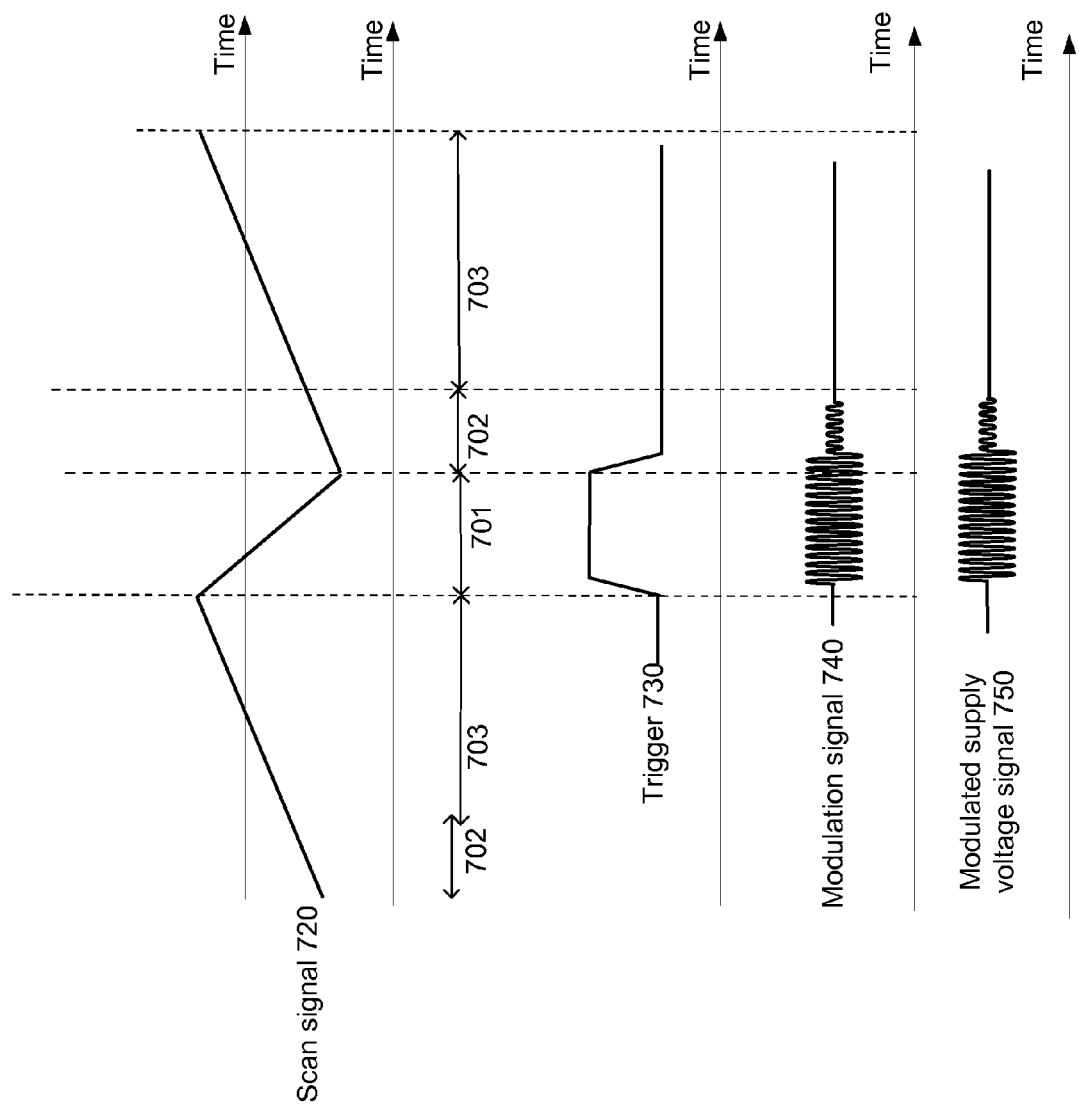
FIG. 6 illustrates a scan signal and a modulated supply voltage signal for a charged particle beam system, according to an embodiment of the invention.

The inductor 400 may be arranged to receive the modulation signal and to perform a modulation, by inductance, of a supply voltage signal that passes through a supply line (such as any one of supply lines 210, 220, 230 and 240), to provide a modulated supply voltage signal (such as modulated supply voltage signal 750 of FIG. 6). The modulation of the supply voltage signal changes a focal length of a charged particle beam 152 that is generated by charged particle beam source 100.

The modulation of the supply voltage signal may defocus the charged particle beam 152. The amount of defocusing is responsive to the strength of the modulation and to the ratio between changes in supply voltage signals and focal length changes.

According to an embodiment of the invention the modulated supply voltage signal can be any one of a filament supply voltage, suppressor voltage, and an acceleration voltage.

Any supply voltage signal that can affect the focal length of the charged particle beam 152 can be modulated. FIGS. 1-4 illustrate the modulation of all of these signals but this need not necessarily be the case for all embodiments of the present invention.

FIGS. 1-4 illustrate modulation, by inductance, of multiple supply voltage signals that pass through multiple supply lines to provide multiple modulated supply voltage signals that are provided to a charged particle beam source. The modulation of the multiple supply voltage signals can affect the relationship between these supply voltage signals but this is not necessarily the case. For example, FIGS. 1-4 illustrate that multiple supply voltage signals are subjected to the same modulation so that the relationship between them maintains unchanged. This may be beneficial as the modulation does not change the currents that are supplied to the charged particle source 100—as the voltage differences remain unchanged.

Referring to FIGS. 1-4, the supply voltage signals are:
a. A suppressor voltage provided by a suppressor voltage supply 320 and which passes through supply line 220 to be provided to electrode 120 of the charged particle beam source 100.
b. An extractor voltage provided by an extractor voltage supply 330 and which passes through supply line 210 to be provided to electrode 110 of the charged particle beam source 100.
c. A filament voltage that is supplied by a filament voltage supply 310 to provide a voltage difference between two supply lines 230 and 240 and which allows a filament current to pass through electrodes 130 and 132 of the charged particle beam source 100.

All of these supply voltage signals ride (or float) on an acceleration voltage provided by acceleration voltage supply 340.

Such a charged particle beam controller 300 is known in the art. It can provide stable voltages and may not be required to perform fast changes in any of the above-mentioned supply voltage signals; thus, it can provide low noise supply voltage signals.

The charged particle beam source 100 includes a tip 150 that emits the charged particle beam 152 and also includes a ground electrode 140 that is connected to electrical ground and to an isolating jacket of cable 200. FIG. 1 illustrates the charged particle beam as impinging on sample 1111.

Each supply line of FIG. 1 is illustrated as being located within a dielectric insulator and all dielectric insulators are located within the isolating jacket. It is noted that other types of cables can be provided.

Each supply line may include an input that is connected to charged particle beam controller 300 and an output that is coupled to charged particle beam source 100. For simplicity of explanation FIG. 1 illustrates an input 201 of cable 200 and an output 202 of cable 200, instead of illustrating the individual inputs and outputs of supply lines 210, 220, 230 and 240.

The inductor 400 may be located in proximity to the output 202. It is noted that by placing the inductor 400 near the output 202 the modulation signals do not "see" the entire capacitance and resistance of the supply lines and thus are not limited (by speed) to the response period dictated by the entire supply lines. In other words, the modulation, once performed near the output of the supply lines, does not need to pass through the entire supply line and can immediately affect the supply voltage signals that pass through the supply line. The modulated supply voltage signal does not need to propagate through the entire supply line or be limited by the slow response period of the charged particle beam controller 300 and thus can be changed by modulation very quickly.

The inductor 400 may include first winding arranged to receive the modulation signal and a coil 420. According to an embodiment of the invention the modulation signal generator 500 is connected to two primary windings 430 and 440 but only one primary winding is activated at any given moment so that effectively primary windings 430 and 440 can be considered as a single primary winding.

Each supply line that passes through an aperture defined by the coil 420 is considered as the secondary winding. Thus, a winding ratio of 1:1 is provided. It is noted that other ratios can be provided. More first windings will result in a division of the voltage of the modulation signal—for example if a 1:2 ratio is provided, then an increase of 10 volts in the modulation signal will result in an increase of about 5 volts in the modulated supply voltage signal.

According to an embodiment of the invention the modulation signal generator 500 is arranged to generate the modulation signal to include multiple repetitions of a cyclic signal. The stabilization of the supply voltage signal after the modulation ends can be shorter once higher frequency signals are used. Thus, using a high frequency cyclic signal assists in reducing the settling period of the supply voltage signal. The modulation signal can include least ten repetitions of a cyclic signal, and the frequency of the cyclic signal may have a frequency of at least ten megahertz.

The de-focusing of the charged particle beam can be performed in synchronicity with the scanning scheme of the charged particle beam. For example, the modulation signal generator 500 may be arranged to generate the modulation signal during at least a portion of a fly-back period of the charged particle beam, and additionally or alternatively during at least a portion of a pre-scan period of the charged particle beam.

The charged particle beam usually scans the sample in a repetitive manner and the de-focusing can also be executed in a repetitive manner. For example, the modulation signal generator 500 may be arranged to generate the modulation signal during at least portions of fly-back periods of the charged particle beam, and additionally or alternatively during at least portions of pre-scan periods of the charged particle beam.

Figure 7:
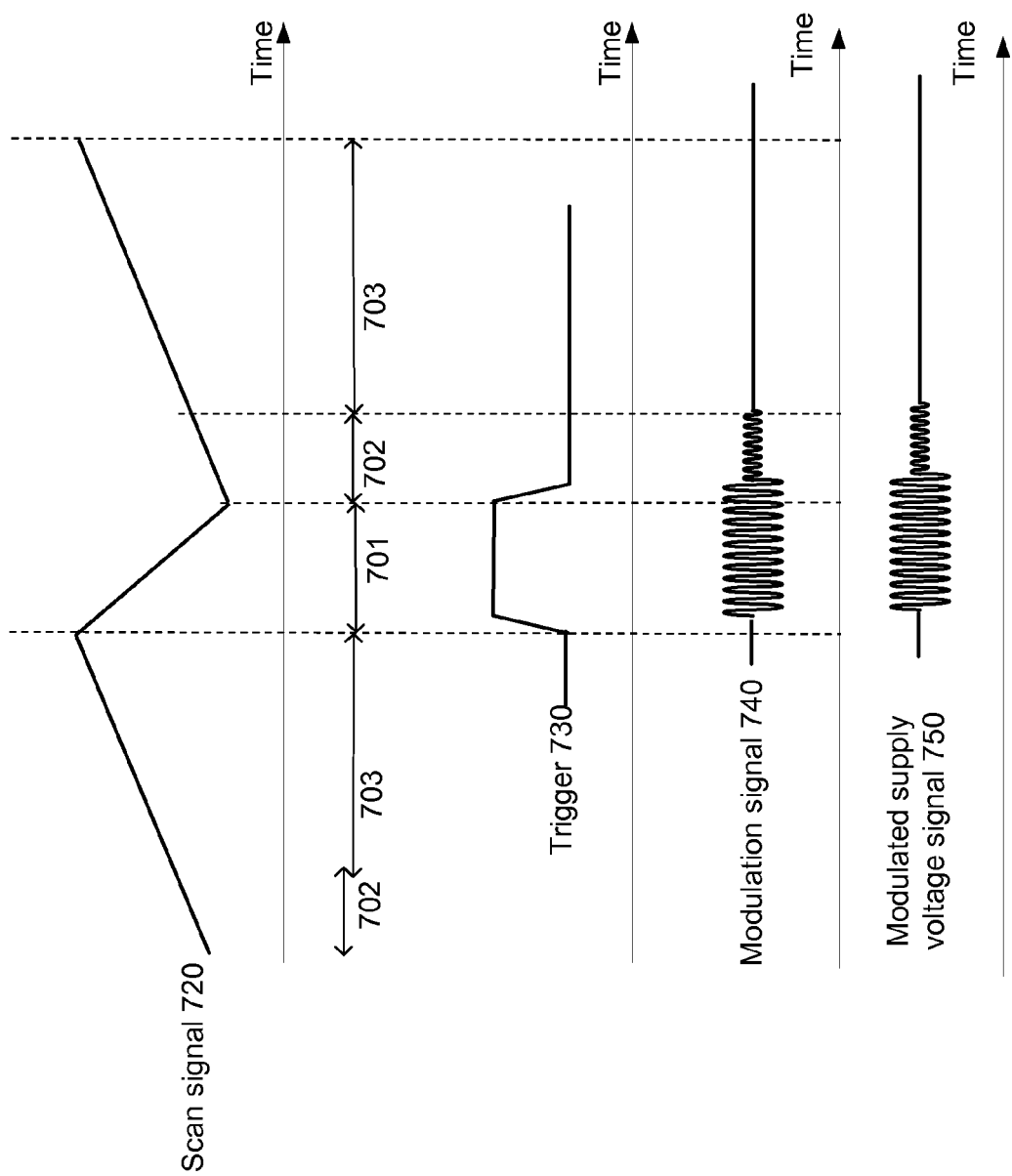
FIG. 7 illustrates a scan signal and a modulated supply voltage signal for a charged particle beam system, according to a further embodiment of the invention.
Figure 8:
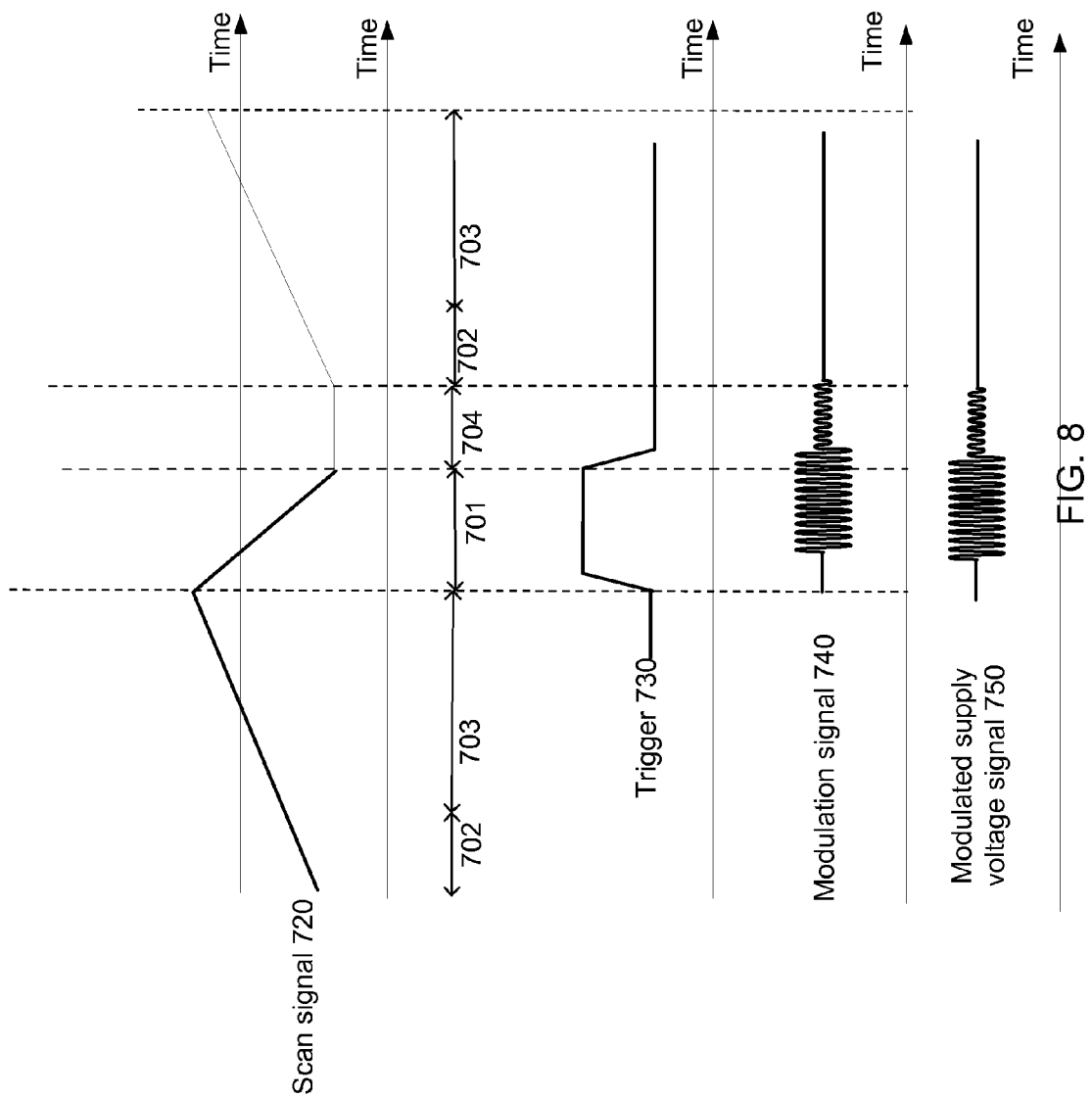
FIG. 8 illustrates a scan signal and a modulated supply voltage signal for a charged particle beam system, according to another embodiment of the invention.

FIGS. 6-8 are timing diagrams according to various embodiments of the invention. These figures illustrate a scan signal 720 that scans the charged particle beam, a trigger 730 that enables the generation of a modulation signal, a modulation signal 740 and a modulated supply voltage signal 750.

The scan signal 720 of FIGS. 6 and 7 rises during pre-scan periods 702 and image grab periods 703. The scan signal 720 decreases during fly-back or retrace periods 701.

The scan signal 720 of FIG. 8 maintains the same level during line shift periods 704 that follow fly-back periods 701.

Trigger 730 of FIGS. 6 and 8 defines the modulation period and allows the generation of the modulation signal 740 during fly-back periods 701 while the trigger 730 of FIG. 7 also allows the modulation signal 740 to be generated during a portion of pre-scan periods 702. Thus, the modulation signal of FIG. 7 is generated during a longer modulation period.

In all figures the modulation signal 740 is illustrated as including a cyclic signal that alternates multiple times during each modulation period. These figures also illustrates that once the modulation period ends the modulation signal 740 stabilizes after experiencing some fluctuations. It is expected to stabilize before image grab periods 703. It is noted that these fluctuations tend to be damped and their amplitude reduced during the stabilization period.

FIGS. 6-8 also illustrate a modulated supply voltage signal 750 that follows the modulation signal 740—it oscillates due to the cyclic nature of the modulation signal 740 during modulation periods, fluctuates during stabilization period and is stabilized during image grab periods.

It is noted that in these figures the stabilization periods ends at the end of the corresponding pre-scan periods but they may be shorter than the corresponding pre-scan periods. It is desirable that the stabilization periods end before the corresponding image grab periods.

Figure 2:
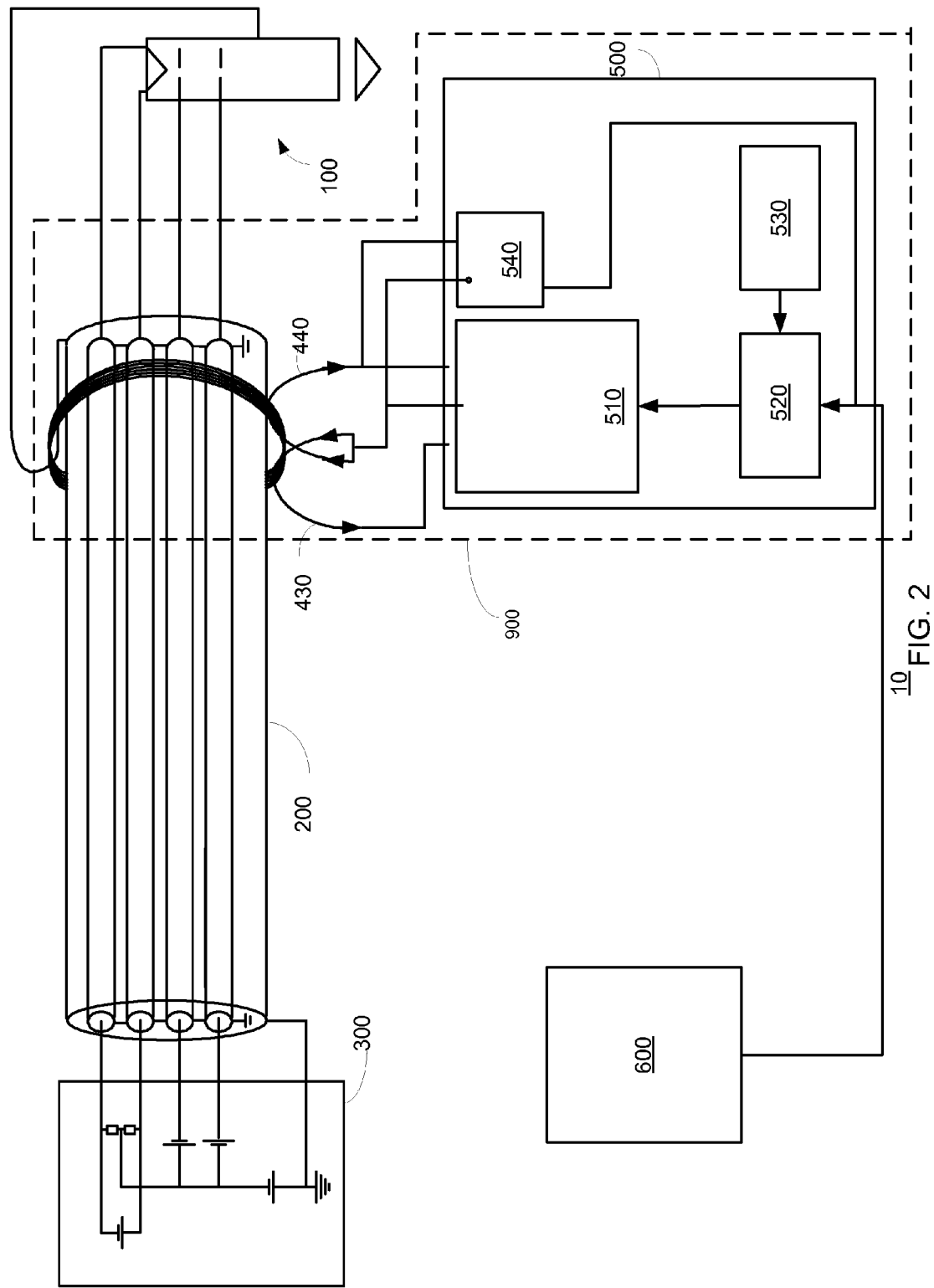
FIG. 2 illustrates a system that includes a modulator according to another embodiment of the invention.
Figure 4:
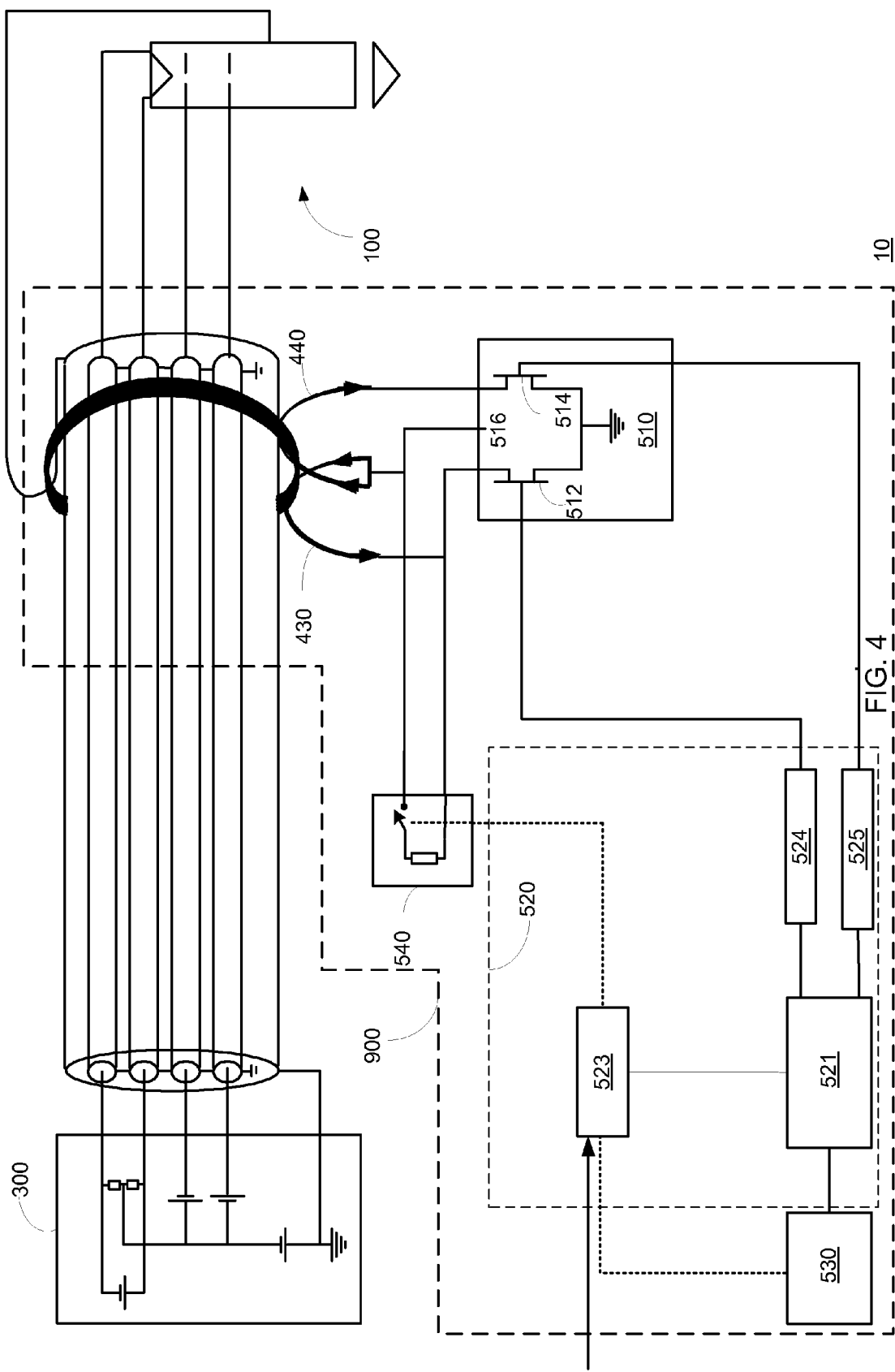
FIG. 4 illustrates a system that includes a modulator according to yet another embodiment of the invention.

The modulation signal generator 500 can have multiple configurations, some of which are illustrated in FIGS. 2 and 4. The modulation signal generator 500 can be any kind of a pattern generator that is able to generate modulation signals during micron and even sub-micron modulation periods and be relatively stable outside of the modulation periods.

FIG. 2 illustrates the modulation signal generator 500 as including a driver 510, a modulation circuit 520, an oscillator 530 and stop circuit 540.

The modulation circuit 520 receives (a) a triggering signal (such as trigger signal 730) that facilitates the generation of a modulation signal, and (b) a high frequency cyclic signal from oscillator 530 and performs a modulation operation to provide electrically modulated signals that are sent to the driver 510. Driver 510 converts the electrically modulated signals to be the modulation signal. The modulation signal is provided by the driver 510 to primary windings 430 and 440.

FIG. 2 illustrates a control and power supply unit 600 that provides supply voltages and the trigger signal to the modulation signal generator 500.

Figure 3:
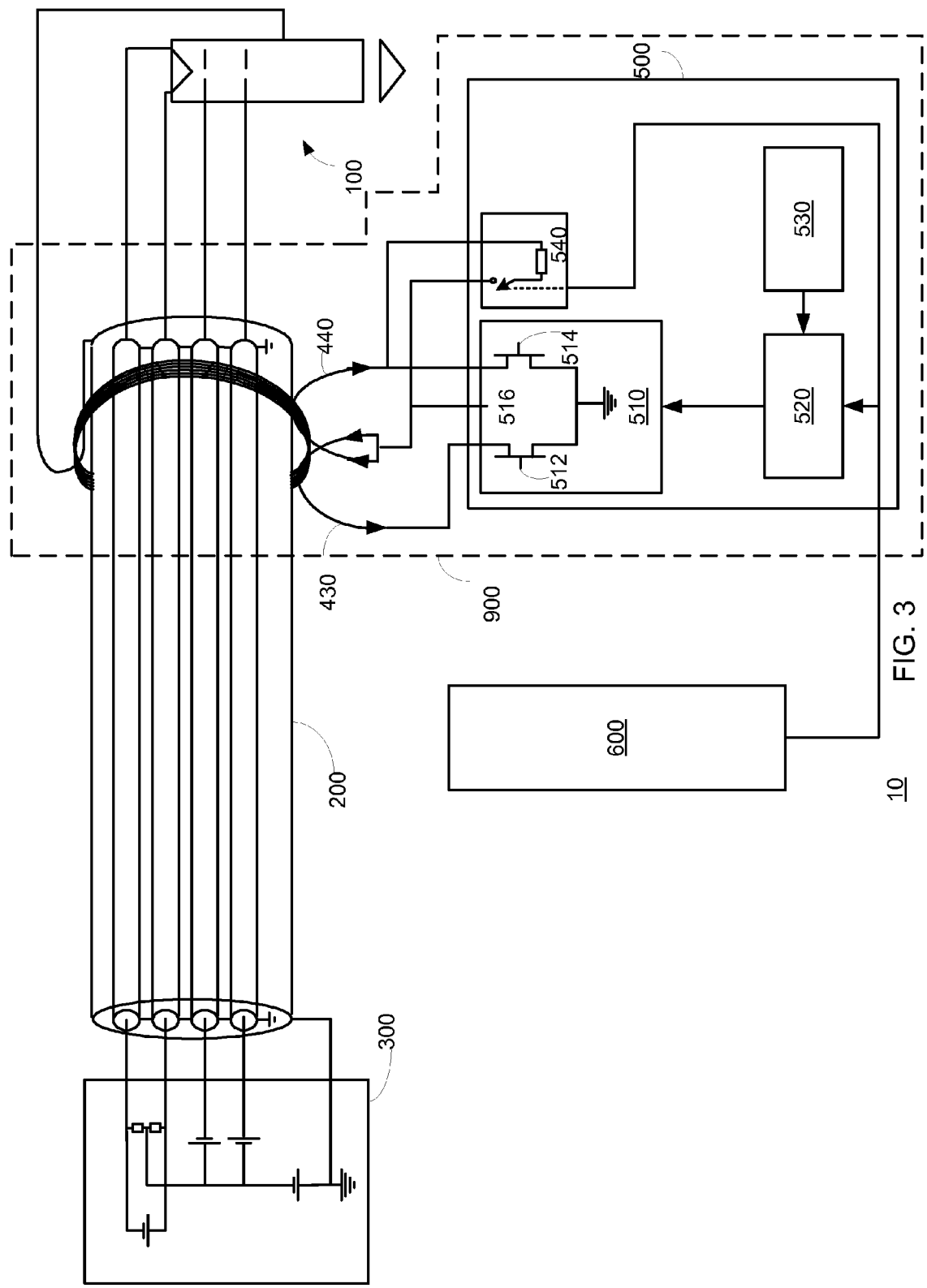
FIG. 3 illustrates a system that includes a modulator according to a further embodiment of the invention.

FIG. 3 illustrates the driver as including two transistors 512 and 514 as well as a voltage supply unit 516. A first transistor 512 is controlled by a first electrically modulated signal while the second transistor 514 is controlled by a second electrically modulated signal. The first and second electrically modulated signals may be in anti-phase or otherwise time shifted in relation to each other so that only one transistor is active at a time.

The first primary winding 430 is connected between the voltage supply unit 516 and the first transistor 512. The second primary winding 440 is connected between the voltage supply unit 516 and the second transistor 514. These connections and made so that the current that flows through the first primary winding 430 (once the first transistor 512 is on) in a direction that is opposite to the flow of the current through the second primary winding 440 (once the second transistor 514 is on). Accordingly, the driver 510 injects a cyclic (alternating) modulation signal to the primary windings 430 and 440.

FIG. 5 is a timing diagram of various signals according to an embodiment of the invention. In particular, FIG. 5 illustrates a first manipulated voltage Vman1 911, a second manipulated voltage Vman2 912, a first primary winding current Iprim1 921, a second primary winding current Iprim2 922 and also includes an illustration of a direction of current induced in the coil 420.

First manipulated voltage Vman1 911 is in anti-phase to second manipulated voltage Vman2 912. The first manipulated voltage Vman1 911 oscillates such that is positive during first periods 901 and is negative during second periods 902. The second manipulated voltage Vman2 912 oscillates such that is negative during first periods 901 and is positive during second periods 902.

During first periods 901 the first manipulated voltage Vman1 911 switches first transistor 512 to its operating state. This results in generation of a first primary winding current Iprim1 921 flowing in a first direction though first primary winding 430, causing a magnetic flux to flow through the coil 420 in a clockwise manner. The current is phase shifted by ninety degrees from the Vman1 911, thus Iprim1 921 flows one fourth of a cycle after the first transistor 512 is turned on—it flows during periods 903 and does not flow during periods 904.

During periods 902 the first transistor 512 is turned off and the second manipulated voltage Vman2 912 causes second transistor 514 to switch to its operating state. This results in generation of a second primary winding current Iprim2 922 flowing in a second direction though second primary winding 440 and causing a magnetic flux to flow through coil 420 in a counter-clockwise manner. The current is phase shifted by ninety degrees from Vman2 912, thus Iprim2 922 flows one fourth of a cycle after the second transistor 514 is turned on—it flows during periods 904 and does not flow during periods 903.

Referring back to FIGS. 2-4, once the modulation period ends there may be a need to shut down or otherwise immediately terminate the modulation signal. This can be done by using a stop circuit 540 that stops or at least assists in dumping unwanted currents from flowing through the coil 420.

FIG. 4 illustrates the stop circuit 540, which is arranged to stop the flow of current through the primary windings and can do so by shorting the two sides of either one of the primary windings 430 and 440 or by allowing a load to drain the primary winding of electromagnetic energy.

FIG. 4 illustrates the modulation circuit 520 as including logic 523, frequency divider 521, and interfaces 524 and 525. Logic 523 sends supply voltage signals to the oscillator 530, to the frequency divider 521 and to the stop circuit 540. The logic 523 can instruct the stop circuit 540 to stop the current through the coil 420 or to at least damp the current by passing it through a load. Logic 523 can instruct the stop circuit 430 to stop the current when the current through the coil is minimal—for example one fourth of a cycle after both transistors 512 and 514 are turned off. During a calibration sequence the optimal time difference (delay) between reception of a command to stop the modulation (for example, when the triggering signal changes it value to zero) and the stopping of the current (activation of the stop circuit 540) can be measured and the optimal (or a sub-optimal) time difference can be set as the time difference that results in the fastest damping of the oscillations. According to another embodiment of the invention, the time difference can be determined in advance of imaging operations of the charged particle beam system.

The oscillator 530 outputs a high frequency cyclic signal having a frequency denoted Fin. It may exceed one megahertz, ten megahertz, twenty megahertz and even more.

The frequency divider 521 receives Fin and converts it to two electrically modulated signals that are in anti-phase in relation to each other (or otherwise phase shifted in relation to each other so as to operate only one transistor of the driver 510 at a time or allow an insignificant overlap between transistor on periods) and at a frequency that is one half of the frequency of Fin. These electrically modulated signals are sent via interfaces 524 and 525.

Interfaces 524 and 525 provide electrically modulated signals to transistors 512 and 514. These interfaces 524 and 525 may also match the voltages or currents of these electrically modulated signals to those required by the first and second transistors 512 and 514.

For example, if Fin equals 20 megahertz then the frequency of each of the electrically modulated signals equals 10 megahertz and one electrically modulated signal can be delayed by 50 nanoseconds in relation to the other.

A modulation period of about 1 microsecond includes ten oscillations per modulation period. Shorter modulation periods may include fewer cycles and, additionally or alternatively, require higher frequency cyclic signals.

Figure 9:
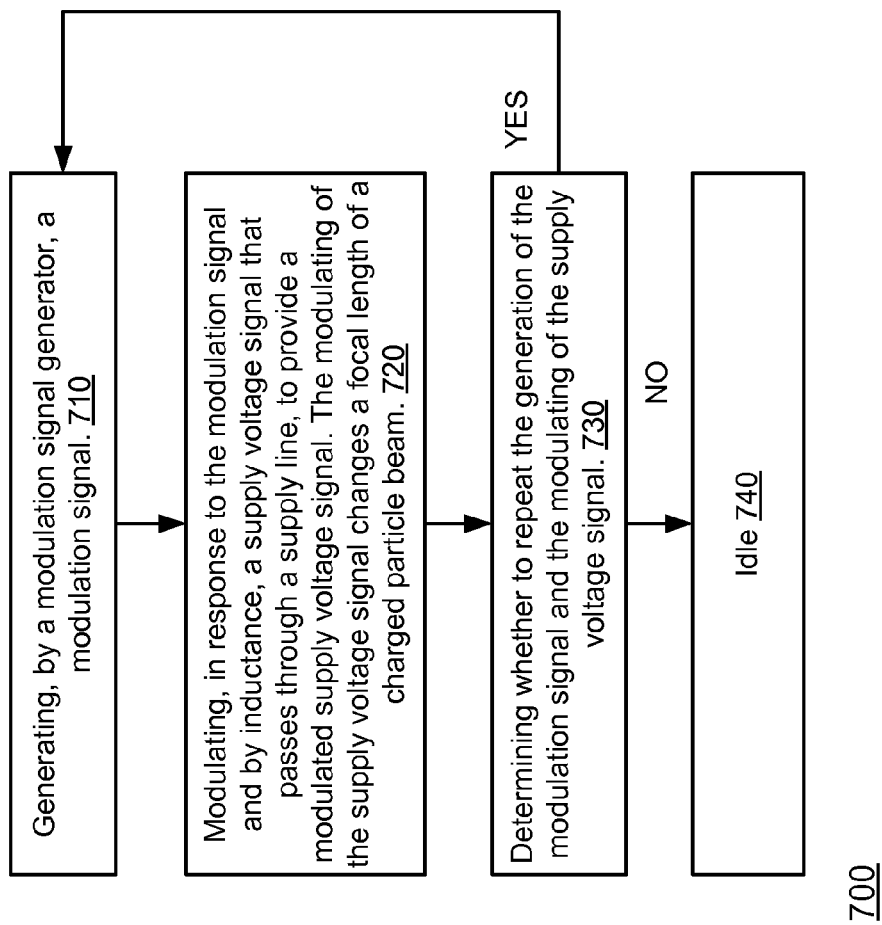
FIG. 9 illustrates a method for generating a modulation signal and modulating a supply voltage signal for a charged particle beam system according to an embodiment of the invention.

FIG. 9 illustrates a method 700 according to an embodiment of the invention. Method 700 begins with step 710 of generating, by a modulation signal generator, a modulation signal. Step 710 is followed by step 720 of modulating, in response to the modulation signal and by inductance, a supply voltage signal that passes through a supply line, to provide a modulated supply voltage signal. The modulating of the supply voltage signal changes a focal length of a charged particle beam. The modulating of step 720 may include causing a defocusing of the charged particle beam. The defocusing can be designed (e.g., by an amount of focal length change) to proved a desired discharging of the sample illuminated by the charged particle beam.

Step 720 may include at least one of:
a. Modulating the supply voltage signal by an inductor that is located near an output of the supply line, the output being coupled to a charged particle beam source.
b. Modulating the supply voltage signal by a modulation signal that includes multiple repetitions of a cyclic signal. The modulation signal can include at least ten cycles of the cyclic signal. The frequency of the cyclic signal can be at least ten megahertz.
c. Modulating the supply voltage signal by the modulation signal during a fly-back period of the charged particle beam.
d. Modulating the supply voltage signal by the modulation signal during at least a portion of a pre-scan period of the charged particle beam.
e. Modulating the supply voltage signal by the modulation signal during at least a portion of a fly-back period of the charged particle beam.
f. Modulating, by inductance, multiple supply voltage signals that pass through multiple supply lines to provide multiple modulated supply voltage signals that are provided to a charged particle beam source.
g. Modulating, by inductance, multiple supply voltage signals that pass through multiple supply lines to provide multiple modulated supply voltage signals that are provided to a charged particle beam source without changing relationships between the multiple supply voltage signals. For example, differences between the supply voltage signals can remain the same.
h. Modulating, by inductance, at least one of the following supply voltage signals: filament supply voltages, a suppressor voltage and an acceleration voltage.
i. Modulating, by inductance, at least two of the following supply voltage signals: filament supply voltages, a suppressor voltage and an acceleration voltage.
j. Modulating, by inductance, the supply voltage signal, stopping the modulation and allowing the supply voltage signal to stabilize before grabbing an image of an area of the sample, the image resulting from scanning the area with the charged particle beam.
k. Modulating, by inductance, the supply voltage signal and stopping the modulation when the current that passes through the inductor is substantially zero.

Steps 710 and 720 can be repeated multiple times. For example, the modulation signal can be generated and the supply voltage signal modulated in a repetitive manner. The timing of the modulating can be synchronized with the scan pattern of the charged particle beam so as to occur during predefined periods such as pre-scan periods, fly-back periods or a combination thereof.

This repetition is illustrated by step 730 of determining whether to repeat the generation of the modulation signal and the modulating of the supply voltage signal. If so, step 730 is followed by step 710, otherwise the method may end or wait until the next time steps 710 and 720 should be repeated. This is illustrated by idle step 740.

The idle stage 740 can be followed by step 710. For example, the method can progress from step 740 to step 710 according to a predefined timing scheme, in response to receiving a trigger, and the like.

Figure 10:
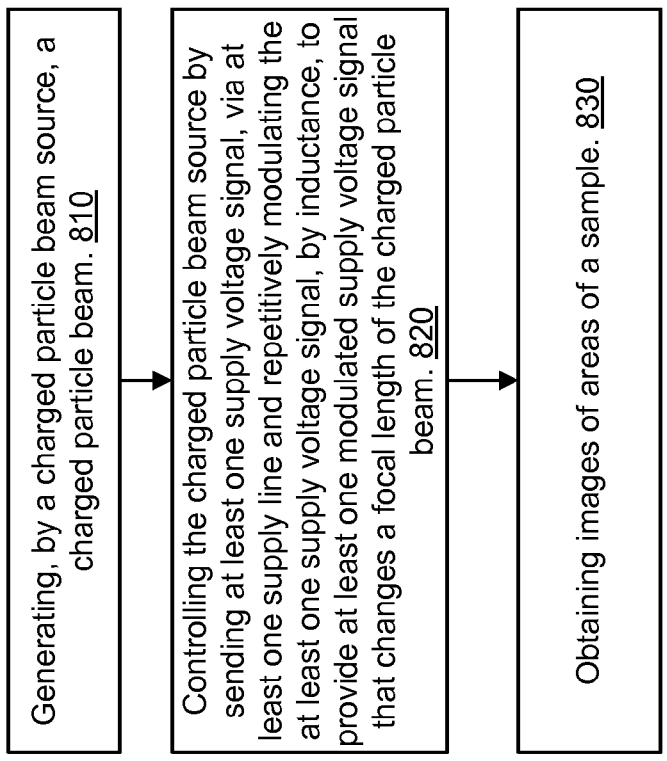
FIG. 10 illustrates a method generating a modulation signal and controlling a charged particle beam system according to an embodiment of the invention.

FIG. 10 illustrates method 800 according to an embodiment of the invention. Method 800 starts with step 810, generating, by a charged particle beam source, a charged particle beam. From there, step 820 of controlling the charged particle beam source by sending at least one supply voltage signal, via at least one supply line and repetitively modulating the at least one supply voltage signal, by inductance, to provide at least one modulated supply voltage signal that changes a focal length of the charged particle beam proceeds.

Step 820 may include at least one of the following:
a. Repetitively defocusing the charged particle beam.
b. Repetitively modulating the supply voltage signal by an inductor that is located near an output of the supply line, the output is coupled to a charged particle beam source.
c. Repetitively modulating the supply voltage signal by a modulation signal that includes multiple repetitions of a cyclic signal. The modulation signal can include at least ten cycles of the cyclic signal. The frequency of the cyclic signal can be at least ten megahertz.
d. Repetitively modulating the supply voltage signal by the modulation signal during fly-back periods of the charged particle beam.
e. Repetitively modulating the supply voltage signal by the modulation signal during at least portions of pre-scan periods of the charged particle beam.
f. Repetitively modulating the supply voltage signal by the modulation signal during at least portions of fly-backs period of the charged particle beam.
g. Repetitively modulating, by inductance, multiple supply voltage signals that pass through multiple supply lines to provide multiple modulated supply voltage signals that are provided to a charged particle beam source.
h. Repetitively modulating, by inductance, multiple supply voltage signals that pass through multiple supply lines to provide multiple modulated supply voltage signals that are provided to a charged particle beam source without changing relationships between the multiple supply voltage signals. For example, differences between these supply voltage signals can remain the same.
i. Repetitively modulating, by inductance, at least one of the following supply voltage signals: filament supply voltages, a suppressor voltage and an acceleration voltage.
j. Repetitively modulating, by inductance, at least two of the following supply voltage signals: filament supply voltages, a suppressor voltage and an acceleration voltage.

k. Repetitively modulating, by inductance, the supply voltage signal, stopping the modulation and allowing the supply voltage signal to stabilize before grabbing images of areas of the sample, the image resulting from scanning the areas with the charged particle beam.

l. Repetitively modulating, by inductance, the supply voltage signal and stopping the modulation when the current that passes through the inductor is substantially zero.

Step 830 follows step 820 and includes obtaining images of areas of a sample. The images can be obtained during image grab periods.

The modulating of the supply voltage signal can occur during idle periods that may include fly-back periods, per-scan periods or portions thereof. The supply voltage signal can be allowed to stabilize after being modulated.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A modulator, comprising:
   an inductor having a first winding and a coil defining an aperture through which a supply line can be passed;
   a modulation signal generator configured to repeat a sequence of a modulation period followed by an image grab period a plurality of times generate a cyclic modulation signal on the coil during the modulation period and dampen the cyclic modulation signal at an end of the modulation period prior to the image grab period, the modulation signal being configured to modulate, by inductance, a supply voltage signal that passes through a the supply line to provide a modulated supply voltage signal adapted to change a focal length of a charged particle beam.

2. The modulator according to claim 1, wherein the modulation of the supply voltage signal defocuses the charged particle beam at a sample.

3. The modulator according to claim 1, wherein the supply line comprises an input that is coupled to a charged particle beam controller and an output that is coupled to a charged particle beam source; the inductor being located in proximity to the output.

4. The modulator according to claim 1, wherein the modulation signal generator is arranged to generate the modulation signal, which modulation signal comprises multiple repetitions of a cyclic signal.

5. The modulator according to claim 1, wherein the modulation signal generator is arranged to generate the modulation signal, which modulation signal comprises at least ten repetitions of a cyclic signal that has a frequency of at least ten megahertz.

6. The modulator according to claim 1, wherein the modulation signal generator is arranged to generate the modulation signal during a fly-back period of the charged particle beam.

7. The modulator according to claim 1, wherein the modulation signal generator is arranged to repetitively generate the modulation signal and the inductor is arranged to repetitively modulate, by inductance, the supply voltage signal.

8. The modulator according to claim 1, wherein the inductor is arranged to modulate, by inductance, multiple supply voltage signals that pass through multiple supply lines to provide multiple modulated supply voltage signals that are provided to a charged particle beam source.

9. The modulator according to claim 8, wherein the inductor is arranged to modulate the multiple supply voltage signals without changing relationships between the multiple supply voltage signals.

10. The modulator according to claim 8, wherein the multiple supply voltage signals are filament supply voltages, a suppressor voltage and an acceleration voltage.

11. A charged particle beam system, comprising:
    a charged particle beam source arranged to generate a charged particle beam and direct the charged particle beam towards a sample;
    a charged particle beam controller arranged to control the charged particle beam source by providing multiple supply voltage signals, via multiple supply lines, to the charged particle beam source to obtain images of areas of the sample during image grab periods;
    a modulator arranged to modulate one or more of the multiple supply voltage signals, by inductance, to provide one or more modulated supply voltage signals that change a focal length of the charged particle beam during idle periods and then dampen the one or more modulated voltage supply signals prior to an image grab period; and
    circuitry that controls the charged particle beam source and modulator to repeat a sequence of an idle period followed by an image grab period a plurality of times.

12. The charged particle beam according to claim 11, wherein the modulator comprises:
    a modulation signal generator arranged to generate a modulation signal; and an inductor, arranged to receive the modulation signal and to perform a modulation, by inductance, of the one or more supply voltage signals that pass through the multiple supply lines, to provide the one or more modulated supply voltage signals.

13. The charged particle beam system according to claim 12, wherein the charged particle beam system is arranged to: obtain images of areas of a sample during image grab periods; and modulate the one or more supply voltage signals and allow the one or more supply voltage signals to stabilize after being modulated during idle periods, wherein an idle period is followed by an image grab period.

14. A method of obtaining image data from a sample using a charged particle beam, the method comprising:
    generating a charged particle beam and directing the beam towards a sample;
    controlling the charged particle beam with a plurality of beam control signals to obtain image data, the controlling including an image grab period preceded by an idle period; and
    modulating one or more of the plurality of beam control signals during the idle period to change a focal length of the charged particle beam and stopping the modulating prior to the image grab period.

15. The method of obtaining image data set forth in claim 14 wherein the step of controlling the charged particle beam includes repeating the sequence of an idle period followed by an image grab period a plurality of times.

16. The method of obtaining image data set forth in claim 14 wherein the plurality of beam control signals includes a filament voltage, a suppressor voltage, and an extractor voltage.

17. The method of obtaining image data set forth in claim 16 wherein the modulating step includes modulating each of the filament voltage, suppressor voltage, extractor voltage and acceleration voltage signals without changing relationships between each signal.

18. The method of obtaining image data set forth in claim 17 wherein each of the filament voltage, a suppressor voltage, and an extractor voltage signals ride on an acceleration voltage signal.

19. The method of obtaining image data set forth in claim 14 wherein the modulation signal includes a high frequency cyclic signal that alternates multiple times during each modulation period.

20. The method of obtaining image data set forth in claim 14 wherein the idle period includes a fly-back period and a pre-scan period.

21. The method of obtaining image data set forth in claim 15 wherein the modulating step modulates one or more of the plurality of beam control signals during at least a portion of the fly-back period and allows the modulated beam control signals to stabilize during at least a portion of the pre-scan period.

22. The method of obtaining image data set forth in claim 14 wherein modulating one or more of the plurality of beam control signals during the idle period defocuses the charged particle beam and discharges an area of the sample that was previously charged during an image grab period.

23. The method of obtaining image data set forth in claim 22 wherein the modulating step generates a modulation signal that comprises at least ten repetitions of a cyclic signal that has a frequency of at least ten megahertz.

24. The modulator set forth in claim 1 wherein the modulated supply voltage signal is further adapted to defocuses the charged particle beam and discharges an area of the sample that was previously charged while being imaged by the focused charged particle beam.

25. The modulator set forth in claim 24 wherein the cyclic modulation signal comprises at least ten repetitions of a signal that has a frequency of at least ten megahertz.

26. The charged particle beam system set forth in claim 11 wherein the one or more modulated supply voltage signals defocuses the charged particle beam and discharges an area of the sample that was previously charged during an image grab period.

27. The charged particle beam system set forth in claim 11 wherein modulator modulates the one or more modulated supply voltage signals with a modulation signal that comprises at least ten repetitions of a cyclic signal that has a frequency of at least ten megahertz.

* * * * *